United States Patent [19]
Bakowsky et al.

[11] Patent Number: 5,977,605
[45] Date of Patent: Nov. 2, 1999

[54] SIC SEMICONDUCTOR DEVICE COMPRISING A PN JUNCTION WITH A VOLTAGE ABSORBING EDGE

[75] Inventors: Mietek Bakowsky; Bo Bijlenga, both of Skultuna, Sweden; Ulf Gustafsson, Linköping; Christopher Harris, Sollentuna; Susan Savage, Järfälla, all of Sweden

[73] Assignee: Asea Brown Boveri AB, Västerås, Sweden

[21] Appl. No.: 08/954,165

[22] Filed: Oct. 20, 1997

Related U.S. Application Data

[62] Division of application No. 08/520,689, Aug. 30, 1995.
[51] Int. Cl.$^6$ .................................................. H01L 23/58
[52] U.S. Cl. .............................. 257/496; 257/493; 257/77
[58] Field of Search ................................. 257/170, 171, 257/493, 496, 77

[56] References Cited

U.S. PATENT DOCUMENTS

| | | | |
|---|---|---|---|
| 3,697,829 | 10/1972 | Huth et al. | 317/235 |
| 4,211,586 | 7/1980 | Fang | 437/127 |
| 4,242,690 | 12/1980 | Temple | 257/496 X |
| 4,375,125 | 3/1983 | Byatt | 29/588 |
| 4,642,669 | 2/1987 | Roggwiller et al. | 357/52 |
| 4,667,393 | 5/1987 | Ferla et al. | 29/576 |
| 4,927,772 | 5/1990 | Arthur et al. | 437/6 |
| 4,947,218 | 8/1990 | Edmond et al. | 257/77 |
| 5,119,148 | 6/1992 | Anderson et al. | 257/496 |
| 5,449,925 | 9/1995 | Baliga et al. | 257/77 |
| 5,459,089 | 10/1995 | Baliga | 437/40 |
| 5,650,638 | 7/1997 | Harris et al. | 257/77 |
| 5,814,840 | 9/1998 | Woodall et al. | 257/103 |

FOREIGN PATENT DOCUMENTS

DD 221 598  12/1983  Germany.
WO 95/32524  11/1995  WIPO.

OTHER PUBLICATIONS

Neudeck et al., 2000 V 6H—SiC P–N Junction Diodes Grown By Chemical Vapor Deposition, Appl. Phys. Lett. 64 (11), Mar. 14, 1994, pp. 1386–1388.

Bhatnagar et al., Comparison of 6H—SiC, 3C—SiC, and Si for Power Devices, IEEE Transactions on Electron Devices, vol. 40, No. 3, March 1993.

*Primary Examiner*—John Guay
*Attorney, Agent, or Firm*—Pollock, Vande Sande & Amernick

[57] ABSTRACT

A semiconductor component, which comprises a pn junction, where both the p-conducting and the n-conducting layers of the pn junction constitute doped silicon carbide layers and where the edge of at least one of the conducting layers of the pn junction, exhibits a stepwise or uniformly decreasing total charge or effective surface charge density from the initial value at the defined working junction to a zero or almost zero total charge at the outermost edge of the junction following a radial direction from the central part of the junction towards the outermost edge.

3 Claims, 5 Drawing Sheets

SIC SEMICONDUCTOR DEVICE COMPRISING A PN JUNCTION WITH A VOLTAGE ABSORBING EDGE

This application is a divisional of U.S. patent application Ser. No. 08/520,689, filed Aug. 30, 1995.

TECHNICAL FIELD

The present invention relates to a semiconductor component with silicon carbide as base a material, wherein the component comprises at least one pn junction and a risk of voltage breakdown due to a strong electrical field at the edge of the junction is reduced as the pn junction displays an edge termination.

BACKGROUND OF THE INVENTION

Semiconductor components based on having silicon carbide as a base material are continuously developed to be used in connection with high temperatures, high power applications and under high radiation conditions. Under such circumstances, conventional semiconductors do not work satisfactorily. Evaluations indicate that SiC semiconductors of power MOSFET-type and diode rectifiers using SiC are able to operate over a greater voltage and temperature interval, e.g. up to 650–800° C., and show better breaker properties such as lower losses and higher working frequencies but nevertheless have a volume 20 times smaller than corresponding silicon components. These possible improvements are based on the favorable material properties that silicon carbide possesses in relation to silicon, such as a higher breakdown field (up to 10 times higher than silicon), a higher thermal conductivity (more than 3 times higher than silicon) and a higher energy band gap (2.9 eV for 6H-SiC, one of the crystal structures of SiC).

As SiC semiconductor technology is relatively new and in many aspects non-optimized, there are many critical manufacturing problems that are to be solved before SiC semiconductor devices may be realized experimentally and manufactured in large quantities. This is especially true for components intended for use in high-power and high-voltage applications.

One of the difficulties to overcome when manufacturing high voltage diodes or other types of semiconductor components comprising a voltage absorbing pn junction is to produce a proper junction termination at the edge of the junction. The electric field across the pn junction is very high, when a reverse voltage is applied across the pn junction.

A high reverse bias generating a strong electric field at the edge of the pn junction implies a great risk of voltage breakdown or flash-over at the edge of the junction. In the region of the component surface, where the pn junction reaches the surface, an increase of the electric field arises compared with the conditions existing within the bulk of the junction. This is due to the changeover from more homogeneous conditions inside the crystal of the component to the abrupt step out of the crystal lattice at the surface. This effect makes it very important to reduce the field concentration where the junction reaches the surface. Combined with efforts to passivate the surface of the component, measures are taken to flatten the electric field at the surface e.g. by acting on how the pn junction emerges at the surface. As an example, it is known from silicon power components to lap (grind or saw) the surface of the edge to a certain angle in relation to the pn junction to thereby flatten the field. Another known technique is to gradually decrease the doping of the conducting area around the junction, so that the doping is reduced towards the outermost edge of the junction (so called Junction Termination Extension, JTE) in order to elimininate field concentration at the edge of the junction. These methods, known from silicon technique, are difficult to apply to components based on silicon carbide due to its being a very hard material; similarly doping through diffusion is extremely difficult, and so on.

The above-mentioned problems have not been solved for pn junctions in SiC. Many of the problems to be solved when developing semiconductor components from SiC are reminiscent of those prevalent at the beginning of the development of the silicon components. Yet, the techniques applicable to silicon cannot be utilized when solving the specific problems related to production of SiC semiconductor components. As an example, doping through diffusion is not feasible for SiC, as diffusion coefficients are negligable below 2270° K. Also, ion implantation of doping elements, a common technique when manufacturing Si components, is difficult to master and not fully developed for SiC.

High voltage diodes from 6H-SiC with epitaxially formed pn junctions and Schottky junctions have been done experimentally (see e.g. M. Bhatnagar and B. J. Baliga, IEEE Trans. Electron Devices, vol. 40, no. 3 pp 645–655, March 1993 or P. G. Neudeck, D. J. Larkin, J. A. Powell, L. G. Matus and C. S. Salupo, Appl. Phys. Lett. vol 64, No 11, 14 March 1994, pp 1386–1388). Some of the problems related to SiC devices have thus been solved, but nothing is discussed about the problems connected to electric field concentration at the edges of the junction.

The electric field may be reduced at the edge of the pn junction by applying a semi-isolating layer to the edge of the junction of a SiC component. Such a solution is described in document PCT/SE94/00482.

Any method or device used to accomplish a semiconductor component corresponding to the principle of Junction Termination Extension at a pn junction composed of Si is not known for use with a component, in which SiC constitutes the base material of the junction. This invention aims at providing a voltage absorbing edge at a pn junction with a structure similar to JTE of a Si component.

The term SiC is used in the following text to refer to any of the principal crystal polytypes of this material known as 6H, 4H, 2H, 3C and 15R.

SUMMARY OF THE INVENTION

The present invention is a semiconductor component, which comprises a pn junction, in which both the p-conducting and the n-conducting layers of the pn junction constitute doped silicon carbide layers and where the edge of at least one of the conducting layers of the pn junction, exhibits a stepwise, or uniformly decreasing total charge, or effective surface charge density, from the initial value at the defined working junction to a zero, or almost zero, total charge at the outermost edge of the junction following a radial direction from the central part of the junction towards the outermost edge.

The invention is also directed to methods for producing such a SiC semiconductor component with a decreasing charge profile.

By manufacturing a SiC semiconductor component with the features described, the concentration of the electric field, when a high reverse voltage is applied to the pn junction, is eliminated as the electrical field is flattened along the extended edge termination. Hence, the risk of a voltage breakdown at the edge of the junction before a breakdown somewhere in the defined working area of the junction is reduced. By forming the edges of a pn junction of SiC material with a structure similar to a Junction Termination Extension (JTE) of prior art silicon devices, the reverse voltage over the junction may be considerably increased, 33 times and more before a breakdown occurs.

Furthermore reliability and long term stability are improved. This is due to the reduction of the electric field in the SiC material at the periphery of the junction. At the same time, the maximum surface electric field must be reduced by at least one order of magnitude. This relieves the stress inflicted on the passivation and isolation of the junction.

The SiC semiconductor component is manufactured according to the invention by means of one of the alternative methods described below which have in common that the junction has a decreasing total charge concentration towards the outer edge.

One way, method A, of achieving the component according to the invention is arrived at by starting with a silicon carbon wafer comprising a doped layer of a first conducting type. On the wafer, at least two doped layers of a second conducting type are epitaxially grown, the doping dose of each new second conducting type layer being successively increased. By means of masking and etching, the layers of the second conducting type are then formed to have differently extending areas, so that the layer closest to the wafer has the greatest extension, while consecutive layers of the second conductive type of successively higher doses are formed with consecutively decreasing areal extension. In the simplest embodiment only two doped layers of the second conducting type are grown and formed: a first layer with a lower dopant dose closest to the wafer, and a second layer with a higher dopant dose on top of the first layer. Etching is then performed in two steps, whereby the first layer is formed to have a greater areal extension than the second layer.

As an alternative manufacturing method, A2, the second layer of the second conducting type is accomplished by implantation of ions (e.g. Al or B for p-type, N for N-type) with the same type of charge carriers as in the first layer; in and an implanted second layer with a higher dose and a lesser extension is obtained at the top of the first layer, whereby the dose of the layers of the second conducting type will decrease towards the edge of the pn junction.

Another advantage that is achieved with a pn junction structured according to the disclosed embodiment is that at least one lower doped layer of the second conducting type is situated between a layer of the first conducting type, and a higher doped layer of the second conducting type. This relieves a problem with the generation of a high electric field within the highly doped layer, when the higher doped layer of the second conducting type directly faces the layer of the first conducting type. The higher doped layer is formed through doping, which may cause damage in the crystal structure of the layer and thereby generate dislocations, and as a result, exert influence on the electric field conditions locally in the crystal lattice. By means of a lower doped layer as surplus protection between a higher doped layer of the second conducting type and the boundary layer itself of the junction, a better quality junction is accomplished.

In an alternative method B, a JTE for a SiC junction is accomplished by use of a first lower doped layer of the second conducting type closest to the boundary of the pn junction, while the pn junction on the surface of the first layer has a higher doped p-base layer of the second conducting type. The thickness of the first layer is then reduced in a series of etching steps towards the outermost limit of the junction, whereby the total charge content of the volume of each layer step of the first layer decreases stepwise as a function of the decreasing thickness of the respective layer step.

The field extending efficiency of the JTE produced according to method B is increased with the number of etched down areas. The influence of the number of steps on the field reduction and field uniformity saturates, however, with a high total number of steps. The maximum number of etched down steps is also limited by the cost associated with increasing complexity of the process. One to four etching steps are realistic and described below.

Another alternative method, C, to arrive at the JTE according to the invention, comprises combination of etching down, in a number of steps, the lower doped first layer of the second conducting type and ion implantation being outside the etched down areas. The ion implantation may be done in one or more steps, where ions, e.g. boron or aluminium, are implanted onto the surface of the pn junction layer of the first conducting type just outside the border of the first layer of the second conducting type. The implantation may be effected in regions, outside one another, where the two regions are provided with different charge content. The purpose of the ion implantation is to control the surface doping and the resulting total volume of charge (the resulting volume field at the junction periphery) and the surface field. The last zone can also be created by a vertical epitaxial growth all over the surface.

Finally, an alternative method D, to perform a Junction Termination Extension of a SiC pn junction is disclosed. The aim is to gradually diminish the doping on the highly doped side of the pn junction (at junction periphery) to secure blocking capability of the high voltage silicon carbide component described in the invention. According to method D, the specific SiC technology of lateral growth may be used to apply the basic principles of electric field reduction in the JTE technique. In method D, a JTE at the periphery of the defined pn junction area is accomplished by laterally growing an epitaxial lower doped edge layer of the second conducting type with decreasing doping concentration towards the outermost limit of the junction. The doping concentration may be reduced continuously, or in steps. Also a onestep process is available, in that the layer thickness due to the lateral growth technique decreases in a direction towards the edge of the junction. Hence the total charge is decreased in the direction from the defined working pn junction area to the outermost edge of the junction. As mentioned, the doping concentration may be varied in steps during the epitaxial growth process of the edge layer. The doping concentration may as well be continuously controlled during the growth process.

In a somewhat different procedure, D2, the laterally grown layer according to method D incorporates a thin layer of Aluminium Nitride, AlN, to provide a low leakage interface between the vertical part and the lateral part of the edge SiC layer.

For all the described alternatives of a SiC component according to the invention, it is possible to insert an extra low doped ($n^{--}$) layer of the first conducting type between the lower doped layer ($n^-$) of the first conducting type and the layers of the second conducting type.

Further small variations of the invention will be illustrated in the embodiments disclosed.

BRIEF DESCRIPTION OF THE DRAWINGS

FIG. 2d shows a semiconductor device of SiC similar to that in FIG. 2b, where an extra lower-doped layer of the first conducting type is performed at the boundary against layers of the second conducting type.

FIG. 3b shows a two-step JTE of the same type as in FIG. 3a.

FIG. 3c shows a one-step JTE of the same type as in FIG. 3a.

FIG. 4b shows a two-step termination corresponding to FIG. 4a.

FIG. 4c shows a one-step termination corresponding to FIG. 4a.

DETAILED DESCRIPTION OF THE PREFERRED EMBODIMENT(S)

The invention is described in a number of embodiments with reference to the drawings.

Figure 1:
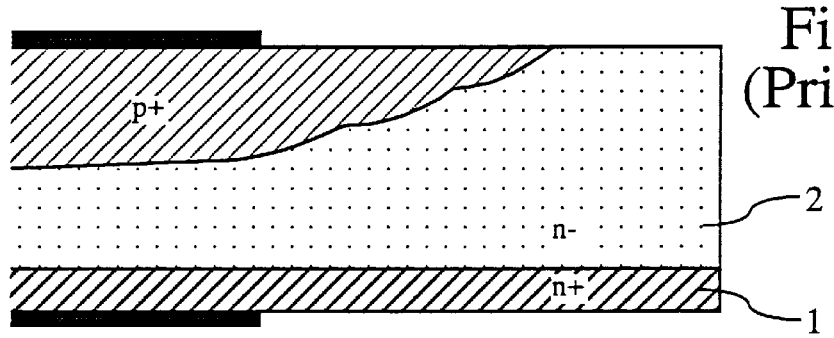
FIG. 1 schematically illustrates a pn junction according to prior art, where a pn junction with a p-conducting and an n-conducting layer has an edge wherein the p-conducting layer has decreasing dosage towards the edge of the pn junction, a so called Junction Termination Extension, JTE.
Figure 2A:
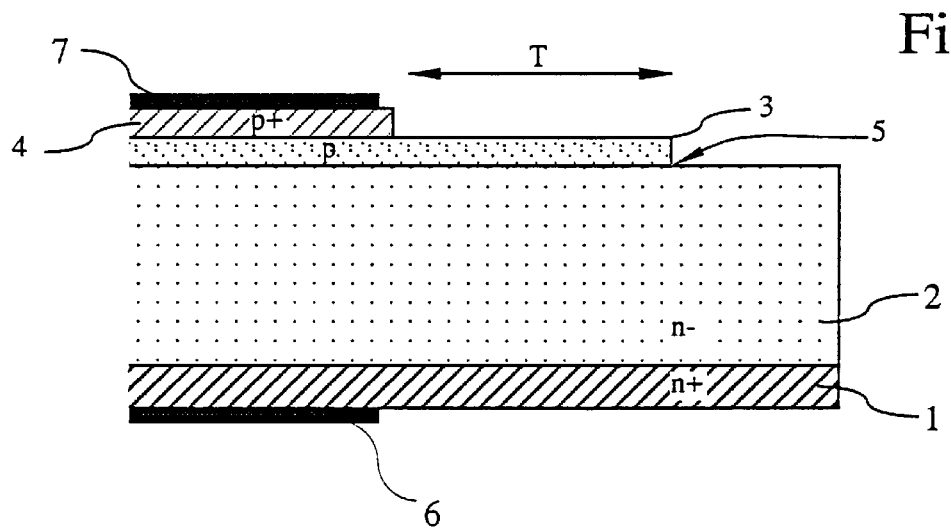
FIG. 2a schematically shows a semiconducting diode of SiC material according to the invention with a voltage absorbing edge, which is edge terminated so that one of the conducting layers of the junction has decreasing total charge of the edge towards the edge of the pn junction achieved by epitaxy and etching in more than one step.

FIG. 2a illustrates an example of a pn junction established by the use of method A according to the invention. The pn junction comprises a semiconducting diode manufactured in SiC. When manufacturing a component according to the example, a substrate of SiC comprising a highly doped (n+) n-conducting layer 1 is used. On top of this n+ layer 1, a first lower doped (n−) n-conducting layer 2 is thereafter epitaxially grown. These two n-conducting layers compose a wafer S of the first conducting type, according to the example n-conducting, on which one or more pn junctions according to the invention can be built. In a second stage-a p-conducting low doped second layer 3 is formed on the wafer according to a known technique. In still another stage of the process, outside this second layer, a third highly doped (p+) p-conducting type layer 4 is grown.

At the next stage, the extension of layer 3 is defined by means of masking and etching. In a fourth stage, the third highly doped layer 4 is laterally formed by means of masking and etching to a more limited areal extension than the underlying second layer 3. As a result, the p-layer on the wafer encloses a decreasing total charge in two steps from the center of the junction towards the outermost edge 5 of the junction.

Of course, it is possible to epitaxially form more than two layers of the second conducting type on top of each other with the technique that is described in principle in FIG. 2a, where the layers successively exhibit higher doping concentrations. As a result the charge content of the junction is decreased laterally towards the edge of the junction, with the results that the electric field outwardly to the edge becomes more evenly extended. By use of this multi-layer procedure, further process steps arise when manufacturing the component.

Figure 2B:
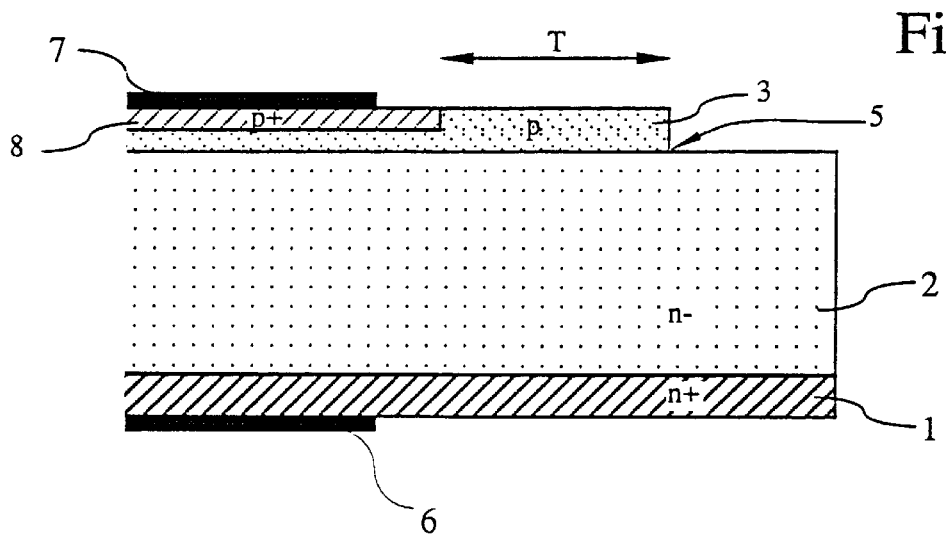
FIG. 2b shows a variation of the edge terminated junction of FIG. 2, wherein a p+ layer is obtained by ion implantation.

FIG. 2b depicts an embodiment wherein a pn junction is accomplished according to method A2, slightly differing from method A. The layers of the first conducting type, n-layers in the example, are arranged in the same way as in method A, where the wafer S constitutes the base for an epitaxially grown second layer 3 of the second conducting type. The second layer 3 is masked, and then a central area of the second layer 3 is implanted with charges of the same type as those in surplus in layer 3, (which in the example means negative charges such as Al or B), whereby a third highly doped layer 8 of the second conducting type is established. An extended edge 5 for the pn junction is generated also in this embodiment by means of etching away the superfluous portion of the second layer 3 of the second conducting type. Otherwise, the component of FIG. 2b corresponds to what has been described related to that Figure, whereby the pn junction according to FIG. 2b comprises at least one layer with a conducting type which encloses a stepwise decreasing charge towards the edge 5 of the junction.

In the following embodiments, the first conducting type will be represented by n-material, whereas the second conducting type is represented by p-material.

Figure 2C:
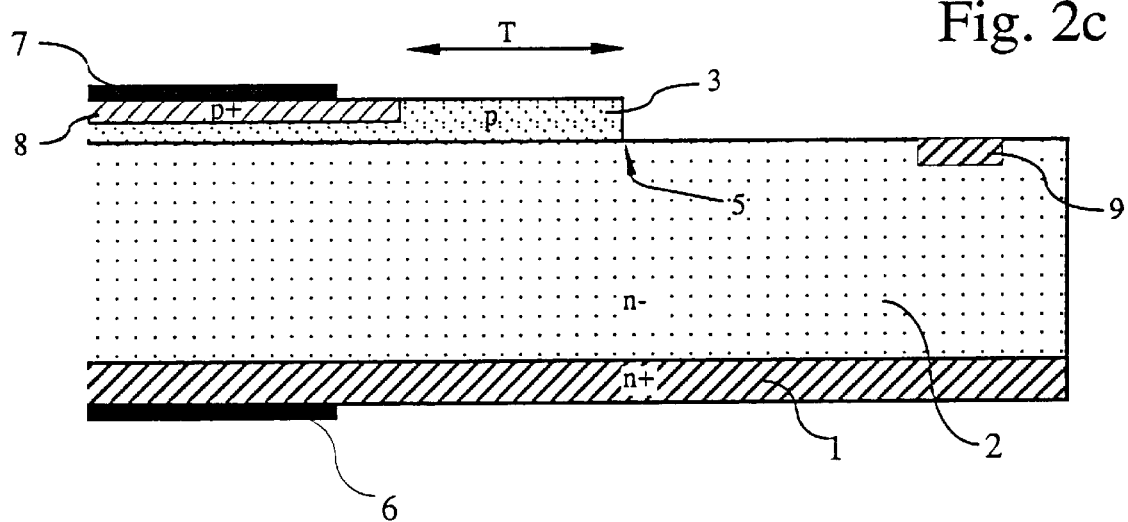
FIG. 2c shows a variation of the edge-terminated junction of FIG. 2, where an n+ stop is implanted.

In another alternative embodiment, according to FIG. 2c, a pn junction is described, produced according to any one of the described embodiments, where a field ring 9, composed of a n+-doped region formed as a ring enclosing the edge 5 of the pn junction, is located at a certain distance from the border of the edge 5 according to methods known from corresponding Si technique.

FIG. 2a–2c further shows, as an example, that a semiconductor of SiC is obtained by connection of a cathode 6 to the highly doped n-layer 1 of the wafer, while an anode 7 is connected to the highly doped p-layer 4.

FIG. 2d shows a semiconductor device SiC similar to that of FIG. 2b, wherein an additional lower doped layer 21 of the first conducting type is formed at the boundary against layers of the second conductivity type.

Figure 3A:
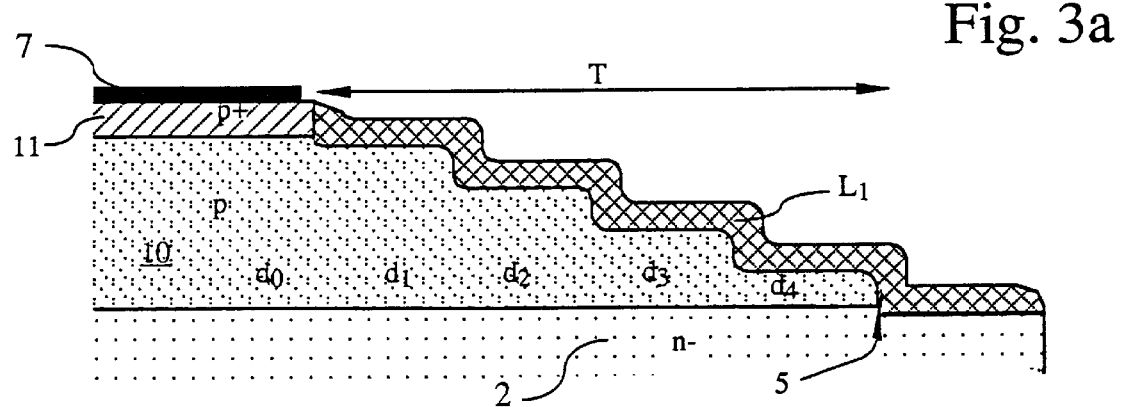
FIG. 3a shows a four step JTE with outward decreasing charge due to reduced thickness of one of the junction layers at the edge.
Figure 3B:
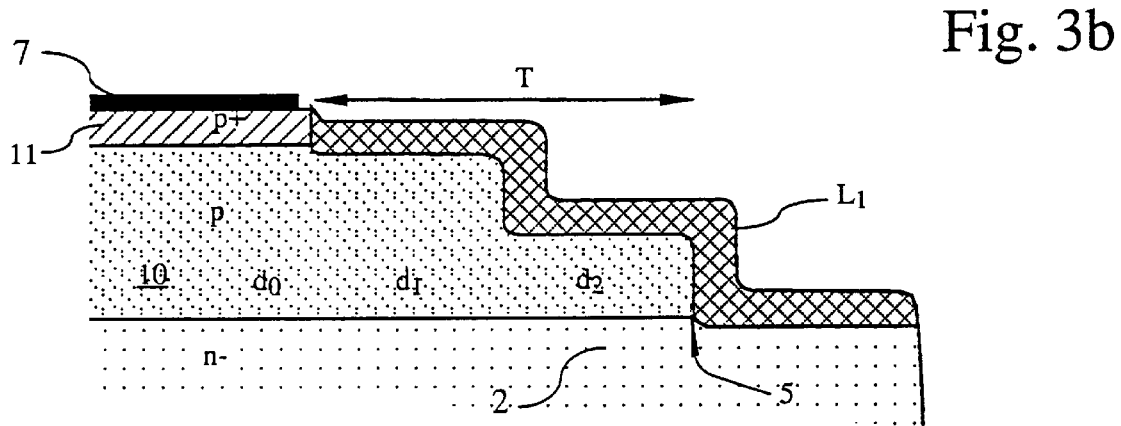
Figure 3C:
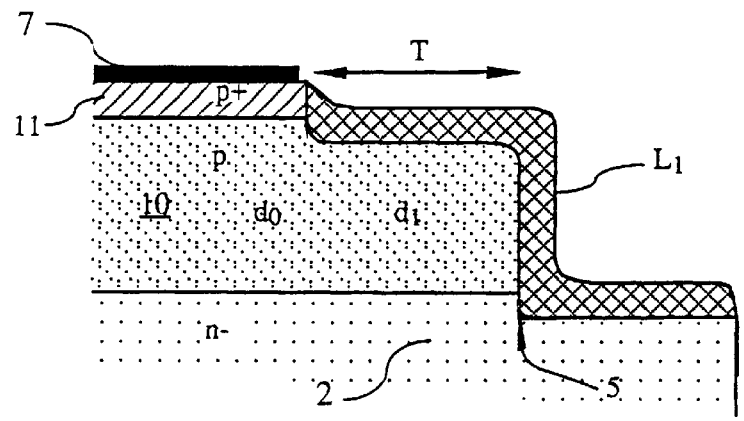

FIGS. 3a to 3c depict another alternative, referred to as method B above, to achieve a junction termination extension of an SiC pn junction. According to FIG. 3a a lower doped p layer 10 has been grown epitaxially on top of a wafer S with a surface including a n-layer 2 as in the previous examples. Also in this alternative, the p-layer 10 is covered at its center portion by a highly doped p+-layer 11. The inventive concept of this embodiment, i.e. obtaining a diminishing charge content of one layer of the junction towards the edge 5, is arrived at by etching the lower doped p-layer 10 in one or several steps so that the thickness of the p-layer is reduced in steps towards the periphery of the junction. The number of etchings may be chosen according to the required efficiency of distribution of the electric field over a larger area. Preferred embodiments are shown in FIGS. 3a to 3c, where in FIG. 3a four etchings have been carried out. The relation between the thicknesses of the four etched down regions of layer 10, assuming constant doping in the layer 10, is shown in FIG. 3a as $$d_0:d_1:d_2:d_3:d_4=100:60:4514\ 50:30-35:20$$

where $d_0$ is the relative thickness of the non-etched portion of the defined working area of the junction, whereas $d_1$–$d_4$ are the respective thicknesses of the regions of the etched down areas of the low doped p-layer 10, $d_4$ being the thickness closest to the edge 5. An estimation of the reduction of the surface field may be calculated from the formula $$R = \frac{E_{sur_{max}}}{E_{sur_{90°MESA}}} < 10\ \% \quad (1)$$

where $E_{sur_{max}}$ is the maximum field at the surface of the p-layer 10 in regions $d_1$–$d_4$ and $E_{sur_{90°MESA}}$ the field existing at a MESA edge with a p-layer terminated by a 90 degree edge where no JTE had been formed.

Further, simpler embodiments of method B are disclosed in FIGS. 3b and 3c, where in FIG. 3b a two-step junction termination is shown, the ratio between the thicknesses of the unetched and the two etched edge regions being $d_0:d_1:d_2=100:60:30-35$. FIG. 3 shows a one-step junction termination, with the corresponding relation between the thicknesses being $d_0:d_1=100:50-60$. The surface field reduction achieved may be estimated by the quotient R according to formula (1) being less than 20% for a device of FIG. 3b and less than 50% for a device of FIG. 3c.

A surface passivation layer Li is also illustrated in FIGS. 3a–4d.

Figure 4A:
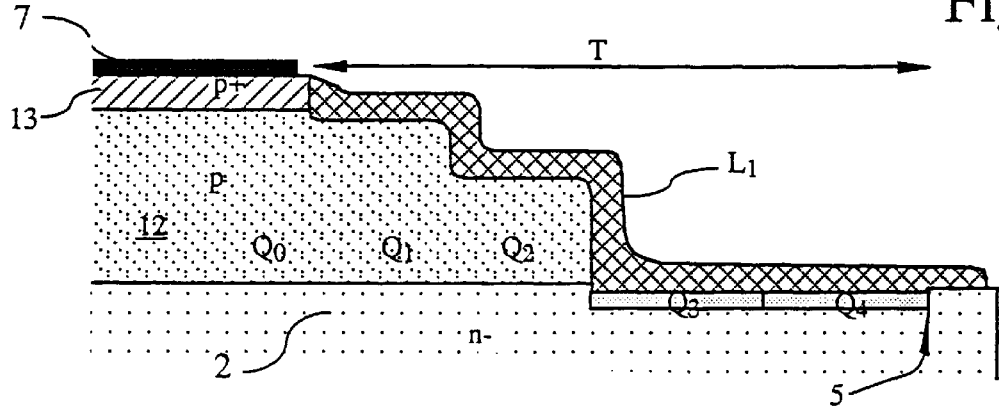
FIG. 4a shows a four step JTE with outward decreasing charge due to reduced thickness of one of the junction layers and with implanted zones of decreasing total charge at the edge of the junction.

Still another alternative, method C, to produce a termination according to the invention is described and illustrated by FIGS. 4a–4d. This method resembles method B, in that the lower doped p-layer 12 is etched down in at least one step in order to give each region a prescribed amount of total charge content, as was also the case in method B. In method C, at least one region of the n--layer 2 of the wafer S outside the border of the p-layer 12 is implanted with negative charges (e.g. boron of aluminium ions) to provide the surface of the n--layer 2 with a thin layer of p-type material. As is shown in FIG. 4a, the symbol $Q_3$ denote the total amount of negative charge in the region. The embodiment of FIG. 4a depicts a four-step junction termination, where the junction is terminated by two etched down regions $Q_1$ and $Q_2$ and outside the end of the p-layer 12 two implanted p-regions $Q_3$ and $Q_4$, respectively. The total charge content of the respective region is given by the relation $$Q_0:Q_1:Q_2:Q_3:Q_4=100:60:45-50:33:20$$

where $Q_0$ represents the total charge of the full depth region of the p-layer 12. The surface field reduction obtained according to formula 1 is calculated to be R<10%.

Figure 4B:
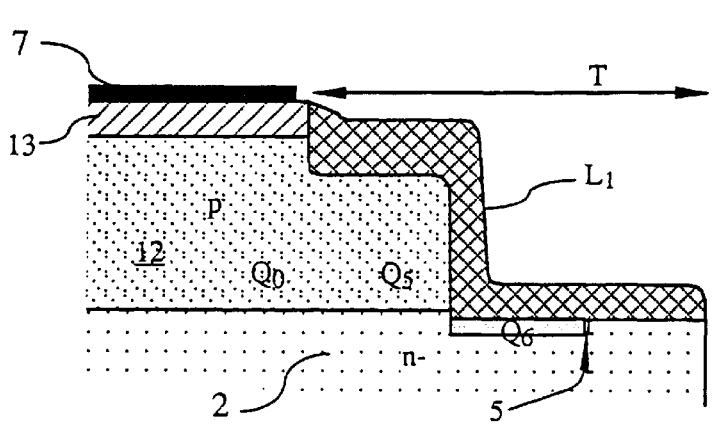
Figure 4C:
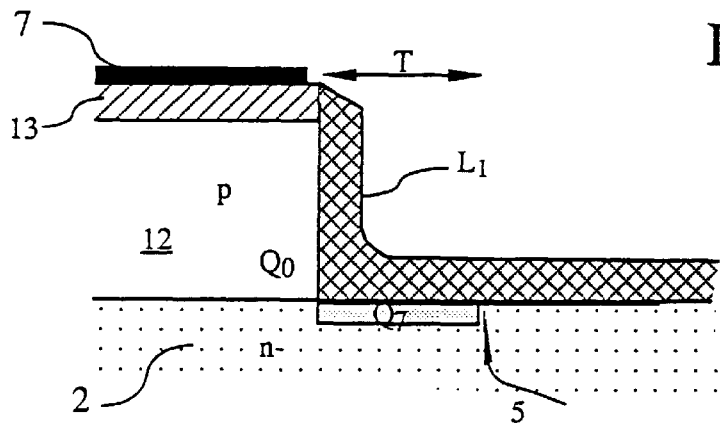
Figure 4D:
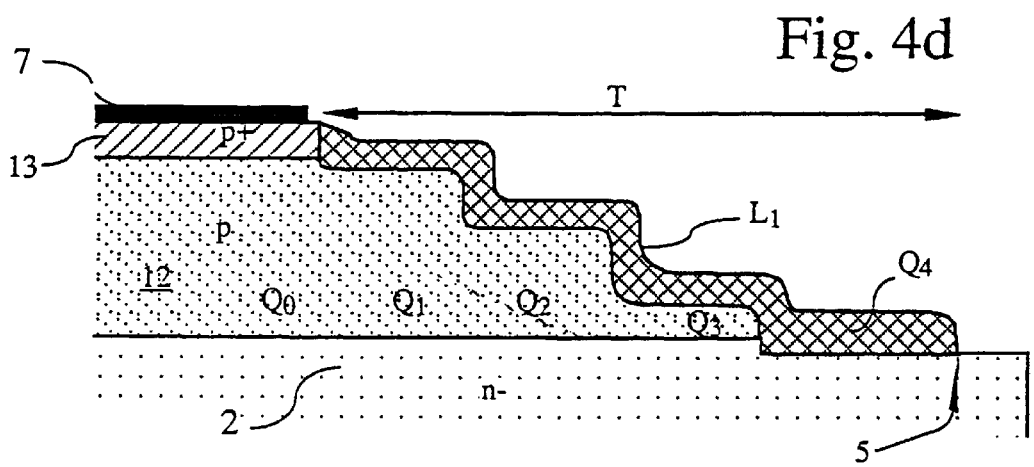
FIG. 4d shows a four-step JTE termination with the fourth zone created by vertical epitaxial growth.

Corresponding edge terminations are shown in FIGS. 4b and 4c, where in FIG. 4b a two-step termination is illustrated showing one etched down step $Q_5$ of p-layer 12 and an implanted p-region $Q_6$ of the n-layer 2. In the same way, a termination according to FIG. 4c is arrived at by a complete etching of the p-layer 12 outside the p+-layer 13 on top of the defined working area of the junction, whereafter a p-layer $Q_7$ of a preferred amount of total charge is implanted outside and at the border of the p-layer 12. In FIG. 4d a four-step JTE termination with the fourth zone created by vertical epitaxial growth is shown.

Method D is finally described with reference to FIGS. 5a–5d. By growing epitaxially a p--layer 17 laterally on a pn junction mesa consisting of a n--layer 15 on a wafer S and a p+-layer 16 formed on the wafer, the epitaxially grown layer 17 will adapt the form as shown in principle in FIG. 5a. The thickness of the lateral layer 17 decreases in a direction from the mesa edge towards the outer border of the lateral layer 17. It has been experimentally verified when epitaxially growing a layer on a mesa edge, that the grown layer will assume the laterally extended form illustrated in FIG. 5a. Due to the reduction of thickness of the laterally formed layer 17, the layer will have by itself the property of distributing the field of the edge termination T constituted by layer 17.

Figure 5A:
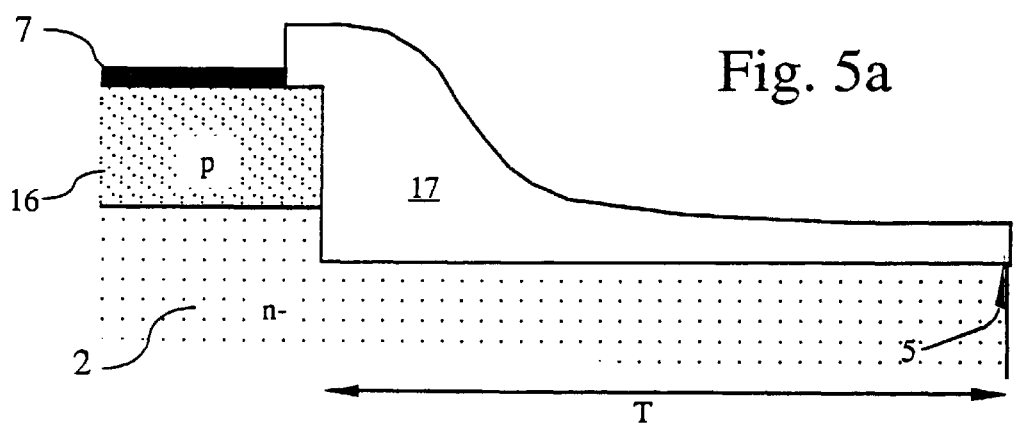
FIG. 5a shows the principle of lateral growth of a junction termination layer.
Figure 5B:
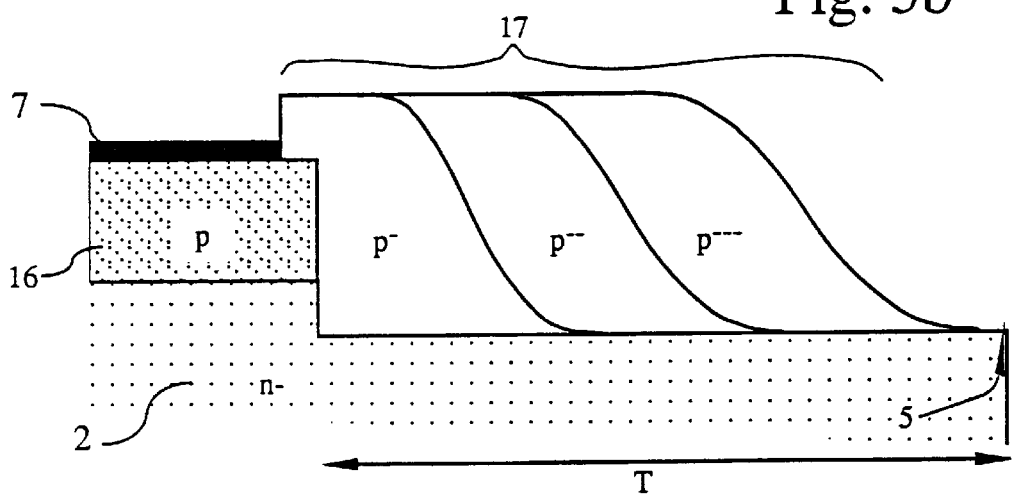
FIG. 5b shows a laterally grown layer with stepwise decreasing doping towards the edge of a pn junction.

By using the described principle of lateral growing of a p--layer 17, where the lateral growth is performed in successive operations with a lowering of the doping in each operation, a junction termination according to FIG. 5b is obtained. A multistep JTE, where the p+ base layer 16 is surrounded by successively grown p-type layers with gradually lower dopings is then established. The successive growth of lower doped layers may involve intermediate etch-back operations or both etch-back and patterning operations to optimize the resulting p-type doping profile of the JTE.

Figure 5C:
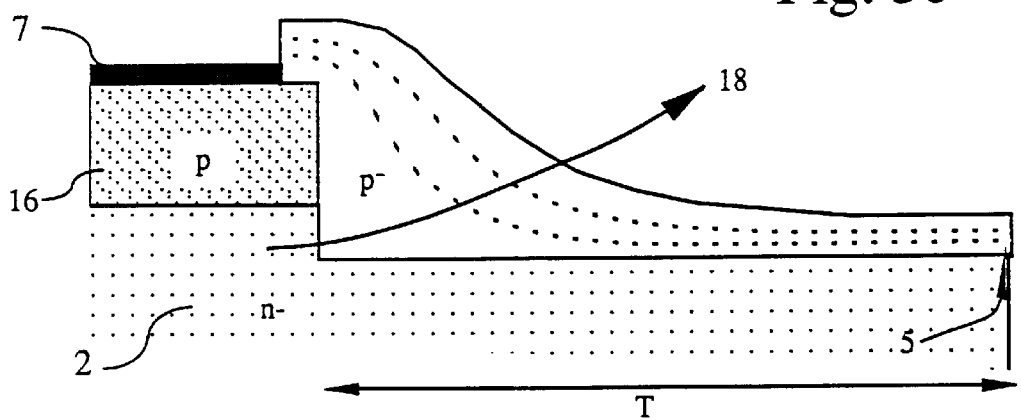
FIG. 5c shows a laterally grown layer with continuously decreasing doping towards the edge of a pn junction.

A similar principle is used in FIG. 5c, where the laterally grown layer 17 receives a gradually decreased doping concentration outwardly by continuous reduction of the dose of the doping gas during the epitaxial lateral growth of layer 17. The arrow 18 shows the direction of diminishing doping concentration.

Figure 5D:
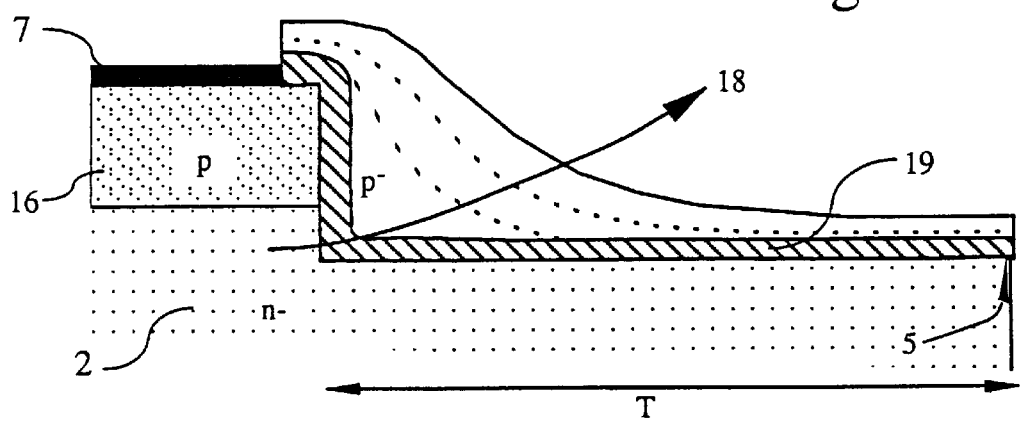
FIG. 5d shows an example of a JTE with an applied laterally grown layer on top of an AlN layer.

In FIG. 5d an embodiment showing a layer 19 of AlN covering an etched mesa of the junction is illustrated. The AlN is grown using the same epitaxial technique as for lateral growth of SiC. The AlN-layer 19 is built before the laterally grown layer 17 is applied to the junction edge. The AlN-layer 19 is incorporated to provide a low leakage interface between the vertical and lateral portions of the mesa. The low leakage interface obtained by inserting a layer of AlN in the form of layer 19 may also be achieved in the embodiments shown in FIGS. 5b and 5c.

The doping concentrations above referred to as symbols can be deduced from the suggestions in the table below.

| | |
|---|---|
| p+ | $10^{18} - 10^{21}$ cm$^{-3}$ |
| p | $10^{15} - 5 \cdot 10^{17}$ cm$^{-3}$ |
| n− | $10^{14} - 10^{16}$ cm$^{-3}$ |
| n+ | $10^{15} - 10^{21}$ cm$^{-3}$ |

We claim:

1. A silicon carbide (SiC) semiconductor component comprising a pn junction having;
   a layer of a first conductivity type, and
   a layer of a second conductivity type,
   said layers constituting a pn junction, the edge of at least one of said layers being provided with an edge termination to reduce an electric field at an edge of the pn junction,
   said second conductivity type layer further comprising
   a first layer having a higher doping and a smaller areal extension than the first conductivity type layer and which at its periphery exhibits a stepwise reduction to zero of its thickness, and
   a second layer having a higher doping and a smaller areal extension than the first layer; and
   wherein a side of the first layer is in contact with a surface of the first conductivity type layer and the second layer is in contact with the opposite side of the first layer.

2. Semiconductor component according to claim 1, further comprising at least one implanted zone of the second conductivity type adjacent and surrounding the first layer, the implanted zone and the first layer constituting the termination.

3. A semiconductor component according to claim 1, wherein the first conducting type layer comprises an additional low doped layer adjacent the first layer of the second conducting type and wherein the additional layer has a lower doping than the rest of the layer of the first conductivity type.

* * * * *

UNITED STATES PATENT AND TRADEMARK OFFICE
CERTIFICATE OF CORRECTION

PATENT NO. : 5,977,605
DATED : November 2, 1999
INVENTOR(S) : Bakowski et al.

It is certified that error appears in the above-identified patent and that said Letters Patent is hereby corrected as shown below:

On the title page, item [75]:

The first Applicant's name should read --Mietek Bakowski--, not "Mietek Bakowsky--.

Signed and Sealed this

Eighth Day of August, 2000

Attest:

Q. TODD DICKINSON

*Attesting Officer*     *Director of Patents and Trademarks*